(12) United States Patent
Hu et al.

(10) Patent No.: US 12,237,144 B2
(45) Date of Patent: Feb. 25, 2025

(54) APPARATUS USING MULTIPLE BEAMS OF CHARGED PARTICLES

(71) Applicant: ASML Netherlands B.V., Veldhoven (NL)

(72) Inventors: Xuerang Hu, San Jose, CA (US); Weiming Ren, San Jose, CA (US); Xuedong Liu, San Jose, CA (US); Zhong-wei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 18/477,213

(22) Filed: Sep. 28, 2023

(65) Prior Publication Data
US 2024/0071711 A1    Feb. 29, 2024

Related U.S. Application Data

(63) Continuation of application No. 17/656,731, filed on Mar. 28, 2022, now Pat. No. 11,804,356, which is a
(Continued)

(51) Int. Cl.
*H01J 37/147*     (2006.01)
*H01J 37/12*      (2006.01)
*H01J 37/26*      (2006.01)

(52) U.S. Cl.
CPC .......... *H01J 37/1477* (2013.01); *H01J 37/12* (2013.01); *H01J 37/26* (2013.01);
(Continued)

(58) Field of Classification Search
CPC ........ H01J 37/1477; H01J 37/12; H01J 37/26; H01J 2237/0213; H01J 2237/0262; H01J 2237/038; H01J 2237/0435
See application file for complete search history.

(56) References Cited

U.S. PATENT DOCUMENTS 6,175,122 B1    1/2001   Groves et al.
6,943,349 B2    9/2005   Adamec et al.
(Continued)

FOREIGN PATENT DOCUMENTS

CN    102687232     9/2012
JP    2001-284230   10/2001
(Continued)

OTHER PUBLICATIONS

Notice of Reasons for Rejection issued by the Japan Patent Office in related Japanese Patent Application No. 2021-165874; mailed Oct. 19, 2022 (4 pgs.).
(Continued)

*Primary Examiner* — Nicole M Ippolito
*Assistant Examiner* — Hanway Chang
(74) *Attorney, Agent, or Firm* — Finnegan, Henderson, Farabow, Garrett & Dunner, LLP

(57) ABSTRACT

Disclosed herein is an apparatus comprising: a first electrically conductive layer, a second electrically conductive layer; a plurality of optics element s between the first electrically conductive layer and the second electrically conductive layer, wherein the plurality of optics elements are configured to influence a plurality of beams of charged particles; a third electrically conductive layer between the first electrically conductive layer and the second electrically conductive layer; and an electrically insulating layer physically connected to the optics elements, wherein the eclectically insulating layer is configured to electrically insulate the optics elements from the first electrically conductive layer, and the second electrically conductive layer.

20 Claims, 16 Drawing Sheets

Related U.S. Application Data continuation of application No. 16/608,741, filed as application No. PCT/EP2018/058631 on Apr. 4, 2018, now Pat. No. 11,289,304.

(60) Provisional application No. 62/492,043, filed on Apr. 28, 2017.

(52) U.S. Cl.
CPC .............. *H01J 2237/0213* (2013.01); *H01J 2237/0262* (2013.01); *H01J 2237/038* (2013.01); *H01J 2237/0435* (2013.01)

(56) References Cited

U.S. PATENT DOCUMENTS

| | | | |
|---|---|---|---|
| 7,244,949 | B2 | 7/2007 | Knippelmeyer et al. |
| 8,294,095 | B2 | 10/2012 | Chen et al. |
| 9,607,805 | B2 | 3/2017 | Liu et al. |
| 9,691,588 | B2 | 6/2017 | Ren et al. |
| 9,922,799 | B2 | 3/2018 | Li et al. |
| 10,141,160 | B2 | 11/2018 | Ren et al. |
| 10,236,156 | B2 | 3/2019 | Ren et al. |
| 10,395,886 | B2 | 8/2019 | Ren et al. |
| 11,289,304 | B2 | 3/2022 | Hu |
| 11,804,356 | B2 * | 10/2023 | Hu .................. H01J 37/3177 |
| 2002/0000766 | A1 | 1/2002 | Ono et al. |
| 2012/0305798 | A1 | 12/2012 | Zonnevylle et al. |
| 2016/0268096 | A1 | 9/2016 | Ren et al. |
| 2017/0025241 | A1 | 1/2017 | Li et al. |
| 2017/0025243 | A1 | 1/2017 | Ren et al. |

FOREIGN PATENT DOCUMENTS

| | | |
|---|---|---|
| JP | 2008034498 A | 2/2008 |
| JP | 2009004366 A | 1/2009 |
| WO | WO 2017/132435 A1 | 8/2017 |
| WO | WO 2018/122176 A1 | 7/2018 |

OTHER PUBLICATIONS

Office Action of the Intellectual Property Office of Taiwan issued in related Taiwanese Patent Application No. 110140104; mailed Feb. 14, 2023 (10 pgs.).

Notification of Reason(s) for Refusal issued in related Korean Patent Application No. 10-2019-7035121; mailed Jun. 16, 2021 (12 pgs.).

First Office Action issued in related Chinese Patent Application No. 2018800278032; mailed Jun. 17, 2021 (9 pgs.).

Search Report issued in related Chinese Patent Application No. 2018800278032; mailed Jun. 9, 2021 (2 pgs.).

Notice for Reasons for Rejection issued by the Japanese Patent and Trademark Office in related JP Application No. 2019-554971, mailed Dec. 11, 2020 (14 pgs.).

English Translation of the Office Action issued by The ROC (Taiwanese) Intellectual Property Office in related International Application No. 107114123, dated Sep. 6, 2019(5 pags).

PCT Notification of Transmittal of the International Search Report and the Written Opinion of the International Searching Authority mailed Jul. 31, 2018, in corresponding PCT International Application No. PCT/EP2018/058631 (11 pgs.).

\* cited by examiner

APPARATUS USING MULTIPLE BEAMS OF CHARGED PARTICLES

CROSS-REFERENCE TO RELATED APPLICATIONS

This application is a continuation of U.S. Non-Provisional patent application Ser. No. 17/656,731, filed on Mar. 28, 2022, which is a continuation of U.S. Non-Provisional patent application Ser. No. 16/608,741, filed on Oct. 25, 2019 (now U.S. Pat. No. 11,289,304), which is a national stage filing under 35 U.S.C. § 371 of International Application No. PCT/EP2018/058631, filed on Apr. 4, 2018, and published as WO 2018/197169 A1, which claims priority of U.S. application 62/492,043, which was filed on Apr. 28, 2017. The contents of these applications are each incorporated herein by reference in their entirety.

TECHNICAL FIELD

This disclosure relates to an apparatus for inspecting or observing samples such as wafers and masks used in a device manufacturing process such as the manufacture of integrated circuits (ICs).

BACKGROUND

A device manufacturing process may include applying a desired pattern onto a substrate. A patterning device, which is alternatively referred to as a mask or a reticle, may be used to generate the desired pattern. This pattern can be transferred onto a target portion (e.g., including part of, one, or several dies) on the substrate (e.g., a silicon wafer). Transfer of the pattern is typically via imaging onto a layer of radiation-sensitive material (resist) provided on the substrate. A single substrate may contain a network of adjacent target portions that are successively patterned. A lithographic apparatus may be used for this transfer. One type of lithographic apparatus is called a stepper, in which each target portion is irradiated by exposing an entire pattern onto the target portion at one time. Another type of lithography apparatus is called a scanner, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor one or more steps of the device manufacturing process (e.g., exposure, resist-processing, etching, development, baking, etc.), a substrate patterned by the device manufacturing process or a patterning device used therein may be inspected, in which one or more parameters of the substrate or the patterning device may be measured. The one or more parameters may include, for example, edge place errors (EPEs), which are distances between the edges of the patterns on the substrate or the patterning device and the corresponding edges of the intended design of the patterns. Inspection may also find pattern defects (e.g., failed connection or failed separation) and uninvited particles.

Inspection of substrates and patterning devices used in a device manufacturing process can help to improve the yield. The information obtained from the inspection can be used to identify defects, or to adjust the device manufacturing process.

SUMMARY

Disclosed herein is an apparatus comprising: a first electrically conductive layer; a second electrically conductive layer; a plurality of optics elements between the first electrically conductive layer and the second electrically conductive layer, wherein the plurality of optics elements are configured to influence a plurality of beams of charged particles; a third electrically conductive layer between the first electrically conductive layer and the second electrically conductive layer; and an electrically insulating layer physically connected to the optics elements, wherein the electrically insulating layer is configured to electrically insulate the optics elements from the first electrically conductive layer, and the second electrically conductive layer.

According to an embodiment, the third electrically conductive layer comprises a plurality of holes, wherein the holes house the optics elements.

According to an embodiment, the optics elements are electrically insulated from the third electrically conductive layer.

According to an embodiment, the third electrically conductive layer is electrically connected to the first electrically conductive layer, the second electrically conductive layer, or both.

According to an embodiment, the first electrically conductive layer and the second electrically conductive layer comprise openings, wherein the openings and the optics element collectively form paths of the plurality of beams of charged particles.

According to an embodiment, the openings have an inverted funnel or counterbore shape.

According to an embodiment, the third electrically conductive layer is positioned between at least two of the optics elements.

According to an embodiment, the first electrically conductive layer, the second electrically conductive layer, and the third electrically conductive layer collectively form cavities that accommodate the optics elements, wherein the cavities are configured to electrically shield the optics elements from one another.

According to an embodiment, the electrically insulating layer comprises discrete portions, each of which is physically connected to one of the optics elements.

According to an embodiment, the electrically insulating layer is physically connected to the first electrically conductive layer, the second electrically conductive layer, or the third electrically conductive layer.

According to an embodiment, the electrically insulating layer is configured to provide mechanical support to the optics elements.

According to an embodiment, the electrically insulating layer is positioned upstream with respect to the optics elements.

According to an embodiment, the electrically insulating layer is positioned downstream with respect to the optics elements.

According to an embodiment, the electrically insulating layer extends between the third electrically conductive layer and the first electrically conductive layer.

According to an embodiment, the electrically insulating layer insulates the first electrically conductive layer from the third electrically conductive layer, the second electrically conductive layer, and the optics elements.

According to an embodiment, the electrically insulating layer comprises an electrically conductive via through the electrically insulating layer, wherein the electrically conductive via electrically connects the first electrically conductive layer to the third electrically conductive layer.

According to an embodiment, the electrically conductive via encircles a cavity formed by the first electrically conductive layer, the second electrically conductive layer, and the third electrically conductive layer and housing one of the optics elements.

According to an embodiment, the electrically insulating layer extends between the third electrically conductive layer and the second electrically conductive layer.

According to an embodiment, the electrically insulating layer insulates the second electrically conductive layer from the third electrically conductive layer, the first electrically conductive layer, and the optics elements.

According to an embodiment, the electrically insulating layer comprises an electrically conductive via through the electrically insulating layer, wherein the electrically conductive via electrically connects the second electrically conductive layer to the third electrically conductive layer.

According to an embodiment, the first electrically conductive layer, the second electrically conductive layer and the third electrically conductive layer comprise a semiconductor or a metal.

According to an embodiment, the optics elements are selected from a group consisting of a lens, a stigmator, a deflector, and a combination thereof.

According to an embodiment, the optics elements are configured to generate an electric field selected from a group consisting of a round-lens electrostatic field, an electrostatic dipole field and an electrostatic quadrupole field.

According to an embodiment, at least one of the optics elements comprises multiple poles.

According to an embodiment, the first electrically conductive layer, the second electrically conductive layer and the third electrically conductive layer are configured to reduce crosstalk or field distribution deformation of the optics elements.

According to an embodiment, the apparatus further comprises a detector configured to capture a signal produced from an interaction of the beams and a sample.

According to an embodiment, the signal comprises secondary electrons or backscattered electrons, Auger electrons, X-ray, or cathodoluminescence.

According to an embodiment, the charged particles comprise electrons.

Disclosed herein is an apparatus comprising: a first electrically conductive layer; a second electrically conductive layer; a plurality of optics elements between the first electrically conductive layer and the second electrically conductive layer, wherein the plurality of optics elements are configured to influence a plurality of beams of charged particles; a third electrically conductive layer between the first electrically conductive layer and the second electrically conductive layer; and an electrically insulating layer physically connected to the optics elements, wherein the electrically insulating layer is configured to electrically insulate the optics elements from the first electrically conductive layer, and the second electrically conductive layer; wherein the electrically insulating layer extends between the third electrically conductive layer and the first electrically conductive layer, or between the third electrically conductive layer and the second electrically conductive layer.

Disclosed herein is an apparatus comprising: a first electrically conductive layer; a second electrically conductive layer; a plurality of optics elements between the first electrically conductive layer and the second electrically conductive layer, wherein the plurality of optics elements are configured to influence a plurality of beams of charged particles; a third electrically conductive layer between the first electrically conductive layer and the second electrically conductive layer; an electrically insulating layer physically connected to the optics elements, wherein the electrically insulating layer is configured to electrically insulate the optics elements from the first electrically conductive layer, and the second electrically conductive layer; and a fourth electrically conductive layer in contact with and upstream to the first electrically conductive layer.

Disclosed herein is an apparatus comprising: a first electrically conductive layer; a second electrically conductive layer; a plurality of optics elements between the first electrically conductive layer and the second electrically conductive layer, wherein the plurality of optics elements are configured to influence a plurality of beams of charged particles; a third electrically conductive layer between the first electrically conductive layer and the second electrically conductive layer; an electrically insulating layer physically connected to the optics elements, wherein the electrically insulating layer is configured to electrically insulate the optics elements from the first electrically conductive layer, and the second electrically conductive layer; and a fifth electrically conductive layer in contact with and downstream to the second electrically conductive layer.

Disclosed herein is a system comprising: a source configured to produce charged particles; an optics system configured to generate with the charged particles multiple probe spots on a surface of a sample and to scan the probe spots on the surface, the optics system comprising any of the above apparatuses.

According to an embodiment, the source is an electron gun.

DETAILED DESCRIPTION

Figure 1A:
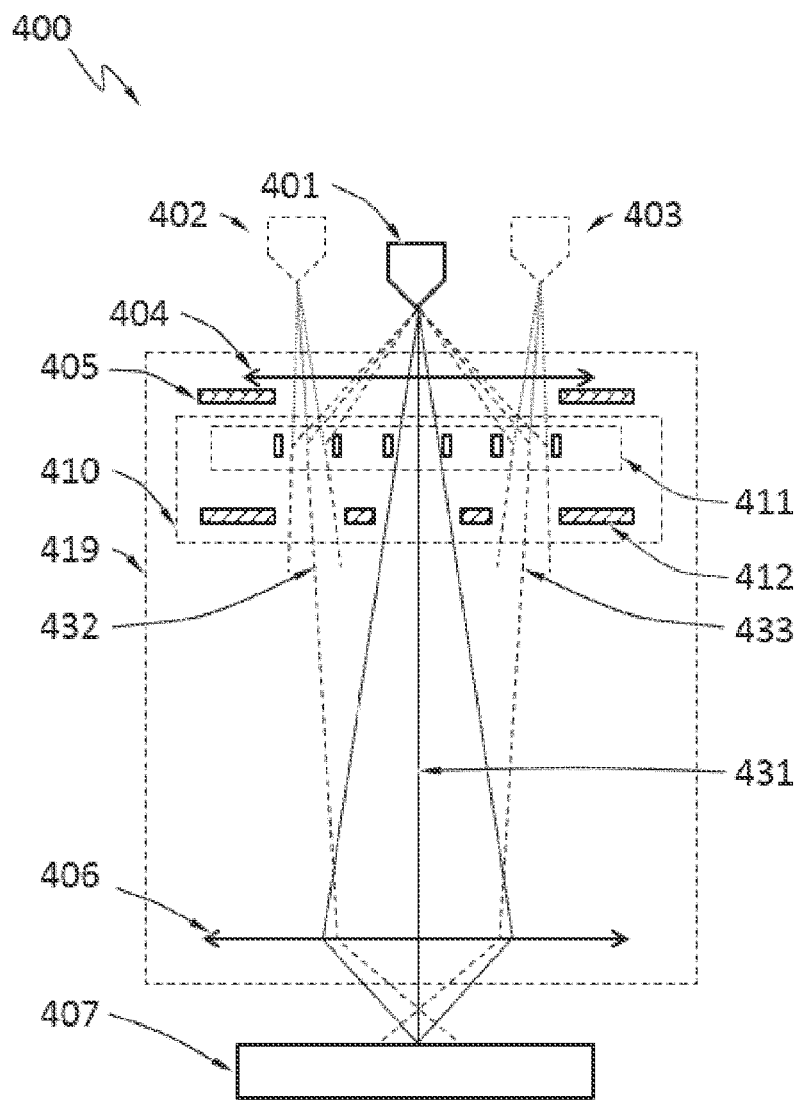
FIG. 1A schematically shows an apparatus that can carry out charged particle beam inspection using multiple beams of charge particles, where the charged particles in the multiple beams are from a single source (a "multi-beam" apparatus).

There are various techniques for inspecting the sample (e.g., a substrate and a patterning device). One kind of inspection techniques is optical inspection, where a light beam is directed to the substrate or patterning device and a signal representing the interaction (e.g., scattering, reflection, diffraction) of the light beam and the sample is recorded. Another kind of inspection techniques is charged particle beam inspection, where a beam of charged particles (e.g., electrons) is directed to the sample and a signal representing the interaction (e.g., secondary emission and back-scattered emission) of the charged particles and the sample is recorded.

Charged particle beam inspection may have higher resolution than optical inspection due to the shorter wavelengths of the charged particles used in the former than the light used in the latter. As the dimensions of the patterns on the substrate and the patterning device become smaller and smaller as the device manufacturing process evolves, charged particle beam inspection becomes more widely used. The throughput of charged particle beam inspection is relatively low due to interactions (e.g., the Coulomb effect) among the charged particles used therein. More than one beam of charged particles may be used to increase the throughput.

In an example, multiple beams of charged particles can simultaneously scan multiple regions on a sample. The scanning of the multiple beams may be synchronized or independent. The multiple regions may have overlaps among them or may be isolated from one another. Signals generated from the interactions of the beams and the sample may be collected by multiple detectors. The number of detectors may be less than, equal to, or greater than the number of the beams. The multiple beams may be individually controlled or collectively controlled.

Multiple beans of charged particles may form multiple probe spots on a surface of a sample. The probe spots can respectively or simultaneously scan multiple regions on the surface. The charged particles of each beam may generate signals from the locations of the probe spots. One example of the signals is secondary electrons. Secondary electrons usually have energies less than 50 eV. Another example of the signals is backscattered electrons when the charged particles of the beams are electrons. Backscattered electrons usually have energies close to lading energies of the electrons of the beams. The signals from the locations of the probe spots may be respectively or simultaneously collected by multiple detectors.

The multiple beams may be from multiple sources respectively, or from a single source. If the beams are from multiple sources, multiple columns may scan and focus the beams onto the surface, and the signals generated by the beams may be detected by detectors in the columns, respectively. An apparatus using beams from multiple sources may be called as a multi-column apparatus. The columns can be either independent or share a multi-axis magnetic or electromagnetic-compound objective lens (see U.S. Pat. No. 8,294,095, whose disclosure is hereby incorporated by reference in its entirety). The probe spots generated by a multi-column apparatus may be spaced apart by a distance as large as 30-50 mm.

If the beams are from a single source, a source-conversion unit may be used to form multiple virtual or real images of the single source. Each of the images and the single source may be viewed as an emitter of a beam (also called a "beamlet" as all of the beamlets are from the same source). The source-conversion unit may have an electrically conductive layer with multiple openings that can divide the charged particles from the single source into multiple beams (also called "beamlets"). The source-conversion unit may have optics elements that can influence the beamlets to form multiple virtual or real images of the single source. Each of the images can be viewed as a source that emits one of the beamlets. The beamlets may be spaced apart by a distance of micrometers. A single column, which may have a projection system and a deflection scanning unit, may be used to scan and focus the beamlets on multiple regions of a sample. The signals generated by the beamlets may be respectively detected by multiple detection elements of a detector inside the single column. An apparatus using beams from a single source may be called as a multi-beam apparatus.

There are at least two methods to form the images of the single source. In the first method, each optics element has an electrostatic micro-lens that focuses one beamlet and thereby forms one real image. (see, e.g., U.S. Pat. No. 7,244,949, whose disclosure is hereby incorporated by reference in its entirety). In the second method, each optics element has an electrostatic micro-deflector which deflects one beamlet thereby forms one virtual image (see, e.g., U.S. Pat. No. 6,943,349 and U.S. patent application Ser. No. 15/065,342, whose disclosures are hereby incorporated by reference in their entirety). Interactions (e.g., the Coulomb effect) among the charged particles in the second method may be weaker than that in the first method because a real image has a higher current density.

FIG. 1A schematically shows an apparatus 400 that can carry out charged particle beam inspection using multiple beams of charge particles, where the charged particles in the multiple beams are from a single source (a multi-beam apparatus). The apparatus 400 has a source 401 that can produce charged particles in free space. In an example, the charged particles are electrons and the source 401 is an electron gun. The apparatus 400 has an optics system 419 that can generate with the charged particles multiple probe spots on a surface of a sample 407 amid scan the probe spots on the surface of the sample 407. The optics system 419 may have a condenser lens 404 and a main aperture 405 upstream or downstream with respect to the condenser lens 404. The expression "Component A is upstream with respect to Component B" as used herein means that a beam of charged particles would reach Component A before reaching Component B in normal operation of the apparatus. The expression "Component B is downstream with respect to Component A" as used herein means that a beam of charged particles would reach Component B after reaching Component A in normal operation of the apparatus. The optics system 419 has a source-conversion unit 410 configured to form multiple virtual images (e.g., virtual images 402 and 403) of the source 401. The virtual images and the source 401 each can be viewed as an emitter of a beamlet (e.g., beamlets 431, 432 and 433). The source-conversion unit 410 may have an electrically conductive layer 412 with multiple openings that can divide the charged particles from the source 401 into multiple beamlets, and optics elements 411 that can influence the beamlets to form the virtual images of the source 401. The optics elements 411 may be micro-deflectors configured to deflect the beamlets. The electric current of the beamlets may be affected by the sizes of the openings in the electrically conductive layer 412 or the focusing power of the condenser lens 404. The optics system 419 includes an objective lens 406 configured to focus the multiple beamlets and thereby form multiple probe spots onto the surface of the sample 407. The source-conversion unit 410 may also have micro-compensators configured to reduce or eliminate aberrations (e.g., field curvature and astigmatism) of the probe spots.

Figure 1B:
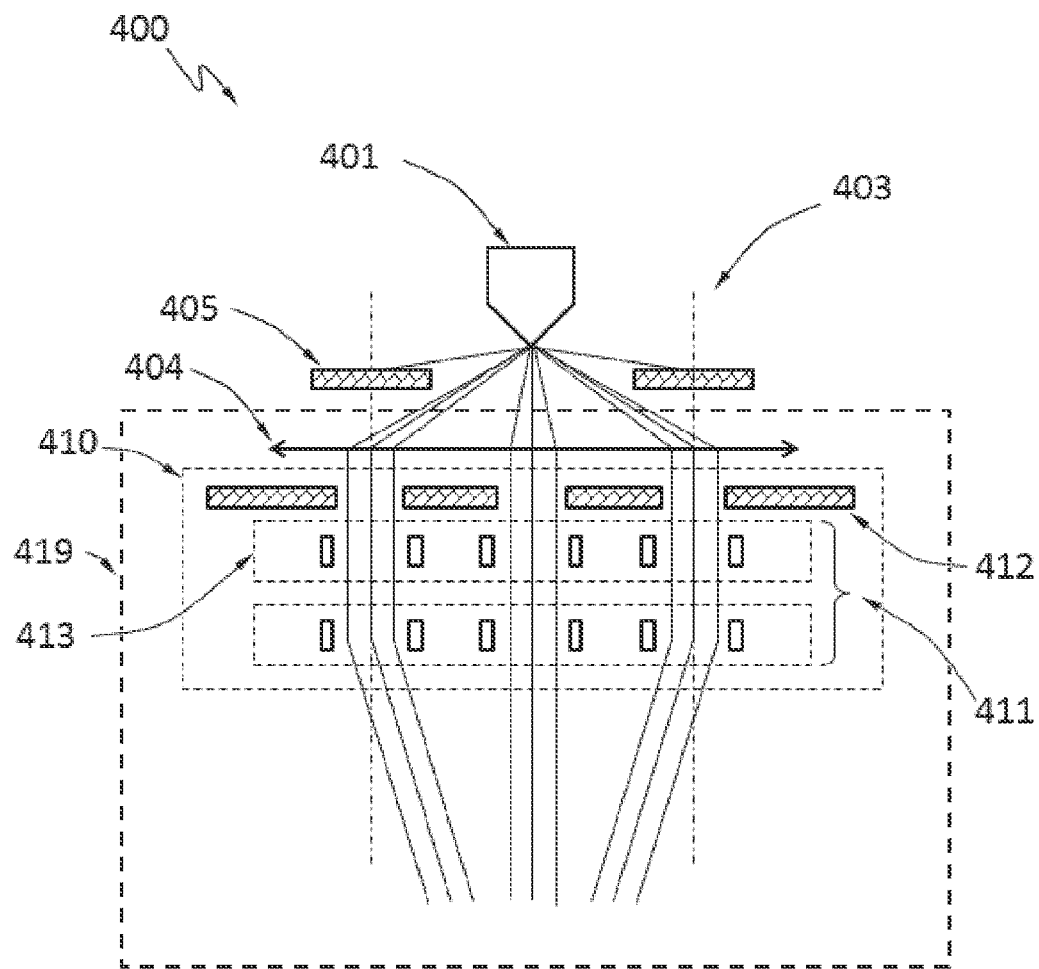
FIG. 1B schematically shows an alternative multi-beam apparatus.

FIG. 1B schematically shows an alternative multi-beam apparatus. The condenser lens 404 collimates the charged particles from the source 401. The optics elements 411 of the source-conversion unit 410 may comprise micro-compensators 413. The micro-compensators 413 may be separate from micro-deflectors or may be integrated with micro-deflectors. If separated, the micro-compensators 413 may be positioned upstream to the micro-deflectors. The micro-compensators 413 are configured to compensate for off-axis aberrations (e.g., field curvature, astigmatism and distortion) of the condenser lens 404 or the objective lens 406. The off-axis aberrations may negatively impact the sizes or positions of the probe spots formed by off-axis (i.e., being not along the primary optical axis of the apparatus) beamlets. The off-axis aberrations of the objective lens 406 may not be completely eliminated by deflection of the beamlets. The micro-compensators 413 may compensate for the residue off-axis aberrations (i.e., the portion of the off-axis aberrations that cannot be eliminated by deflection of the beamlets) of the objective lens 406, or non-uniformity of the sizes of the probe spots. Each of the micro-compensators 413 is aligned with one of the openings in the electrically conductive layer 412. The micro-compensators 413 may each have four or more poles. The electric currents of the beamlets may be affected by the sizes of the openings in the electrically conductive layer 412 and/or the position of the condenser lens 404.

Figure 1C:
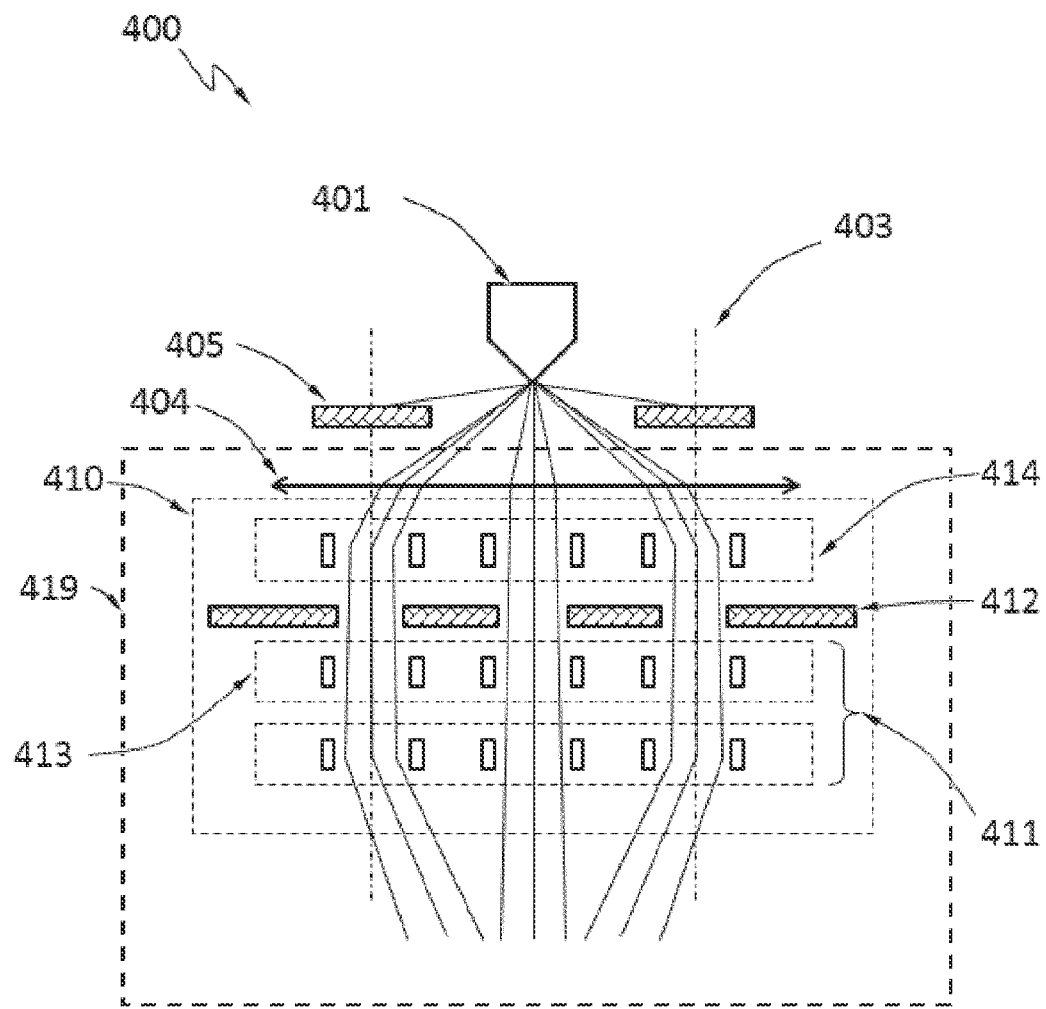
FIG. 1C schematically shows an alternative multi-beam apparatus.

FIG. 1C schematically shows an alternative multi-beam apparatus. The optics elements 411 of the source-conversion unit 410 may comprise pre-bending micro-deflectors 414. The pre-bending micro-deflectors 414 are micro-deflectors configured to bend the beamlets before they go through the openings in the electrically conductive layer 412.

Additional descriptions of apparatuses using multiple beams of charge particles from a single source may be found in U.S. Patent Application Publications 2016/0268096, 2016/0284505 and 2017/0025243, U.S. Pat. No. 9,607,805, U.S. patent application Ser. Nos. 15/365,145, 15/213,781, 15/216,258 and 62/440,493, and PCT Application PCT/US17/15223, the disclosures of which are hereby incorporated by reference in their entirety.

When two optics elements (e.g., the micro-deflectors or micro-compensators in FIG. 1A, FIG. 1B or FIG. 1C) in a source-conversion unit (e.g., the source-conversion unit 410 in FIG. 1A, FIG. 1B or FIG. 1C) are close to one another, there may be crosstalk between them. Namely, the electric field caused by one optics element may extend into the beam path of another optics element and affect the beam transmitting through the other optics element. For example, the micro-deflectors in the source-conversion unit 410 may bend the beamlets by electric fields and the electric field generated by one micro-deflector may extend into the beam path of a neighboring micro-deflector, thereby causing the beamlet through the neighboring micro-deflector to bend by an amount in addition to the bending caused by the electric field generated by the neighboring micro-deflector. Similarly, for example, the electric field (e.g., a quadrupole field or a round-lens field) generated by one of the micro-compensators in the source-conversion unit 410 may extend into the beam path of a neighboring micro-compensator, and thereby influencing the beamlet through the neighboring micro-compensator, by an amount in addition to the influence caused by the electric field generated by the neighboring micro-compensator.

Figure 2A:
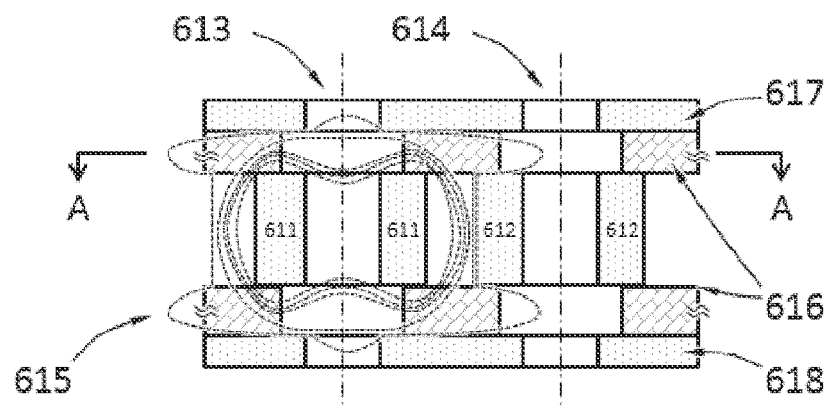
FIG. 2A schematically shows crosstalk between two optics elements in a source-conversion unit in a multi-beam apparatus.
Figure 2B:
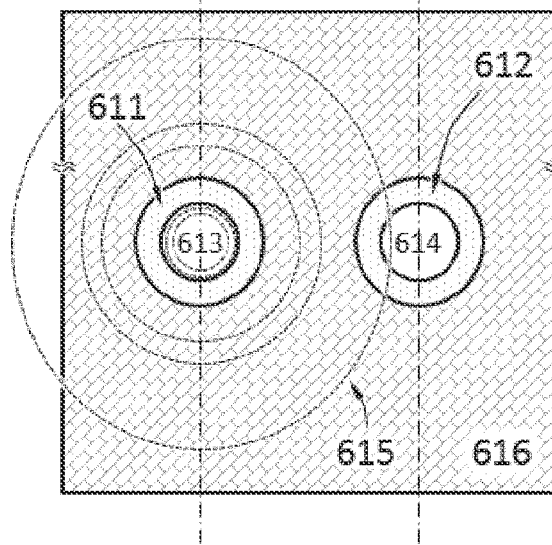
FIG. 2B schematically shows a cross-sectional view along section A-A of FIG. 2A.

The crosstalk tends to be more serious if the optics elements are closer to one another (e.g., integrated into one wafer or a stack of wafers). As an example, FIG. 2A schematically shows crosstalk between two optics elements 611 and 612 integrated in a stack of wafers. FIG. 2B schematically shows a cross-sectional view along section A-A of FIG. 2A. The optics elements 611 and 612 are attached to an insulation layer 616. There is an electrically conductive plate 617 with openings (e.g., circular in shape) upstream to the optics elements 611 and 612, or an electrically conductive plate 618 with openings (e.g., circular in shape) downstream to the optics elements 611 and 612. The optics elements 611 and 612 may have circular electrodes or multiple poles. When the optics element 611 is set at a potential different from the potentials of the conductive plates 617 and 618, an electric field is generated to influence (e.g., compensate for field curvature aberration of) a beamlet transmitting along a beam path 613 through the optics element 611. The equipotential lines 615 in FIG. 2A and FIG. 2B represent an electric field when the conductive plates 617 and 618 and the optics element 612 are at the same potential that is different from the potential of the optics element 611, the openings in the electrically conductive plates 617 and 618 are circular, and the optics elements 611 and 612 have circular electrodes. As shown by the extensive size of the equipotential lines 615, the electric field extends into a beam path 614 through the optics element 612. A beamlet passing through the optics element 612 thus may be affected not only by the electric field the optics element 612 generates but also by the electric field the optics element 611 generates, i.e., optics elements 611 and 612 have crosstalk.

As shown in FIG. 2B, the equipotential lines 615 are not axisymmetric because the structure surrounding the optics element 611 is not axisymmetric. Hence the electric field the optics element 611 generates comprises not only an axisymmetric component (also called a round-lens field), which compensates for the field curvature aberration, but also high order rotation-symmetric components such as a deflection field and a stigmator field. The high order components add aberrations to the beamlet passing through the optics element 611.

Figure 3A:
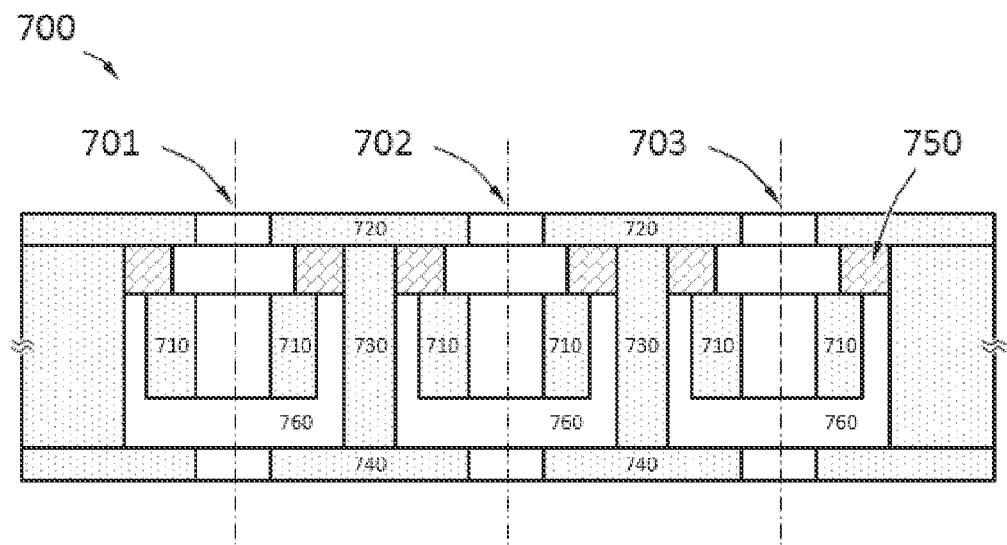
FIG. 3A, FIG. 3B, FIG. 3C, FIG. 3D, FIG. 3E and FIG. 3F each schematically show a portion of the source-conversion unit in a multi-beam apparatus, according to an embodiment.
Figure 3B:
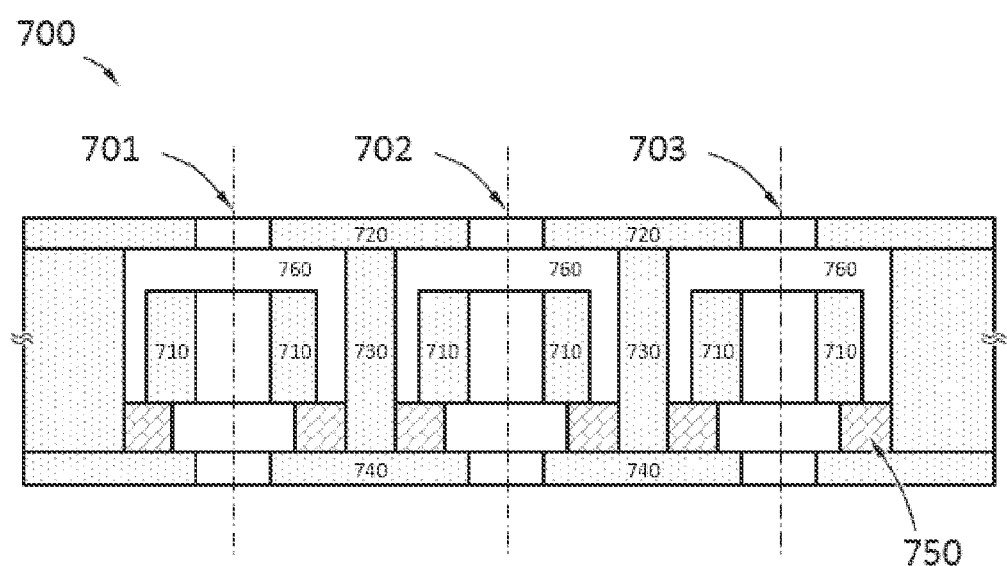

FIG. 3A and FIG. 3B each schematically show a portion 700 of a source-conversion unit of a multi-beam apparatus, according to an embodiment. The portion 700 has multiple optics elements 710 (e.g., micro-deflectors, micro-lenses, micro-stigmators, micro-compensators) sandwiched between a first electrically conductive layer 720 and a second electrically conductive layer 740. The first electrically conductive layer 720 and the second electrically conductive layer 740 have openings that, collectively with the optics elements 710, form paths (e.g., paths 701, 702 and 703) of the beamlets. The portion 700 also has a third electrically conductive layer 730 with multiple holes that house the optics elements 710. The third electrically conductive layer 730 extends between the first electrically conductive layer 720 and the second electrically conductive layer 740. The third electrically conductive layer 730 is electrically connected to the first electrically conductive layer 720, or the second electrically conductive layer 740, or both. The third electrically conductive layer 730 is positioned between at least two of the optics elements 710, i.e., a plane the beam paths of the two optics elements 710 are on or crosses the third electrically conductive layer 730. The walls among the holes of the third electrically conductive layer 730 can provide electrostatic shielding among the optics elements 710. The portion 700 has an electrically insulating layer 750. The electrically insulating layer 750 is physically connected to the optics elements 710. For example, the electrically insulating layer 750 may have discrete portions, each of which is physically connected to one of the optics elements 710. The electrically insulating layer 750 is physically connected to the first electrically conductive layer 720, the second electrically conductive layer 740, or the third electrically conductive layer 730. The electrically insulating layer 750 can provide mechanical support to the optics elements 710 and electrically insulate the optics elements 710 from the first electrically conductive layer 720, the second electrically conductive layer 740, and the third electrically conductive layer 730. The first electrically conductive layer 720, the second electrically conductive layer 740, and the third electrically conductive layer 730 collectively form cavities 760 electrically shielded from one another, where each of the cavities 760 accommodates one of the optics elements 710. The cavities 760 may have circular cross-sectional shape. The first electrically conductive layer 720, the second electrically conductive layer 740, and the third electrically conductive layer 730 may also be magnetically conductive to magnetically shield the beam paths from outside stray magnetic fields. In the examples shown in FIG. 3A and FIG. 3B, the electrically insulating layer 750 is positioned upstream and downstream with respect to the optics elements 710, respectively. In the examples shown in FIG. 3A and FIG. 3B, the third electrically conductive layer 730 is electrically connected to both the first electrically conductive layer 720 and the second electrically conductive layer 740.

Figure 3C:
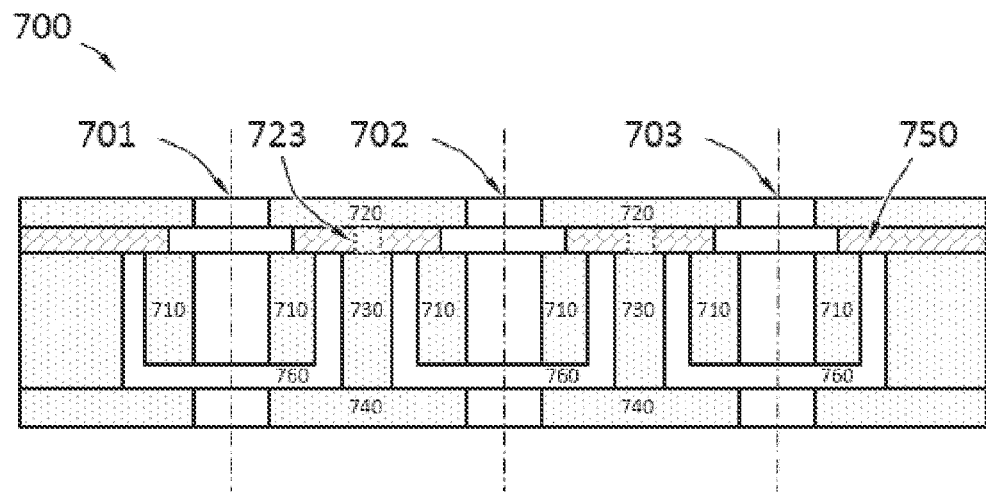
Figure 3D:
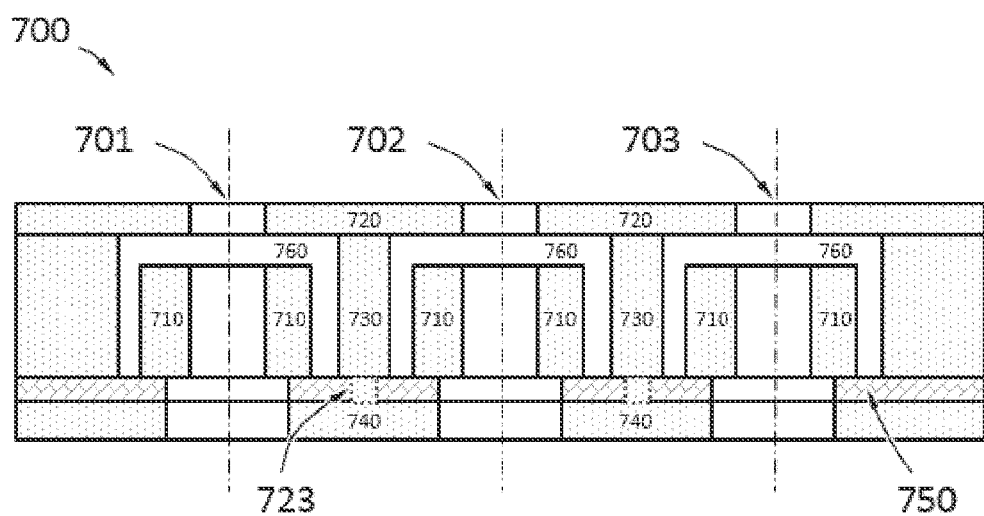

FIG. 3C and FIG. 3D each schematically show a portion 700 of a source-conversion unit of a multi-beam apparatus, according to an embodiment. The example shown in FIG. 3C is the same as the example in FIG. 3A, except that the electrically insulating layer 750 extends between the third electrically conductive layer 730 and the first electrically conductive layer 720. The electrically insulating layer 750 electrically insulates the first electrically conductive layer 720 from the optics elements 710. The electrically insulating layer 750 electrically may also insulate the first electrically conductive layer 720 from the third electrically conductive layer 730, and the second electrically conductive layer 740. The electrically insulating layer 750 may have one or more electrically conductive vias 723 through it and the conductive vias 723 electrically connect the first electrically conductive layer 720 to the third electrically conductive layer 730. The electrically insulating layer 750 can be very thin, such as less than 100 microns, less than 50 microns or less than 10 microns. The electrically insulating layer 750 can be an oxide, nitride or any other suitable material.

Figure 3E:
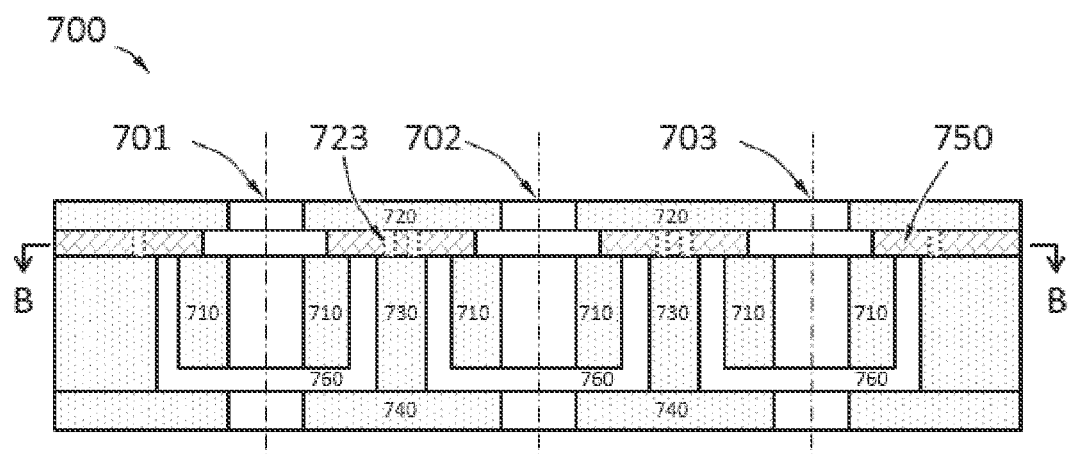
Figure 3F:
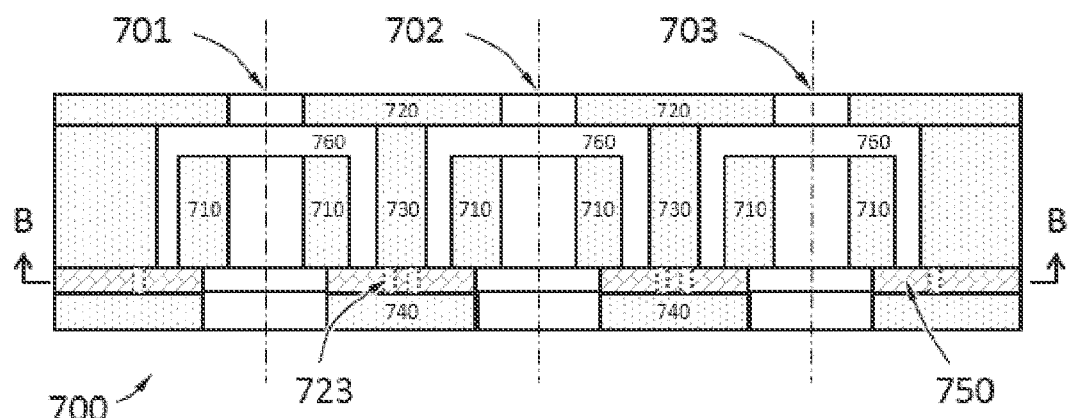
Figure 3G:
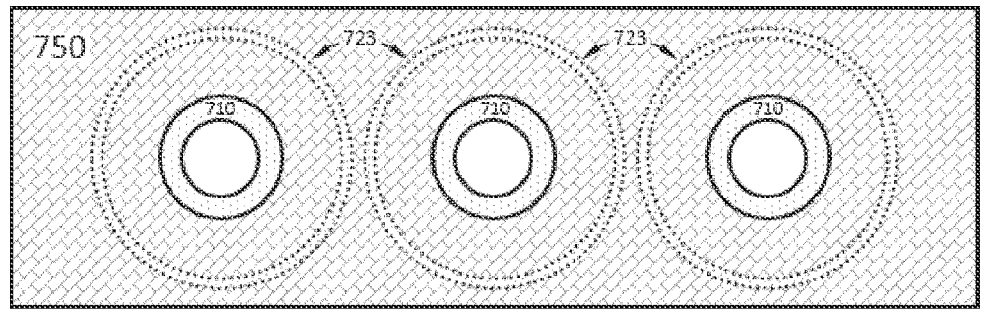
FIG. 3G schematically shows a cross-sectional view along section B-B of FIG. 3C or FIG. 3D.
Figure 3H:
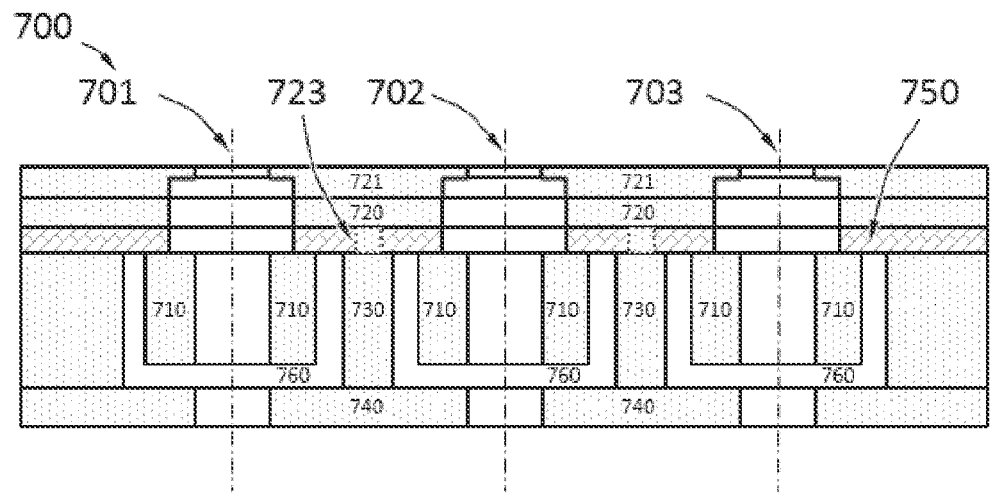
FIG. 3H and FIG. 3I each schematically show a portion of the source-conversion unit of a multi-beam apparatus, according to an embodiment.
Figure 3I:
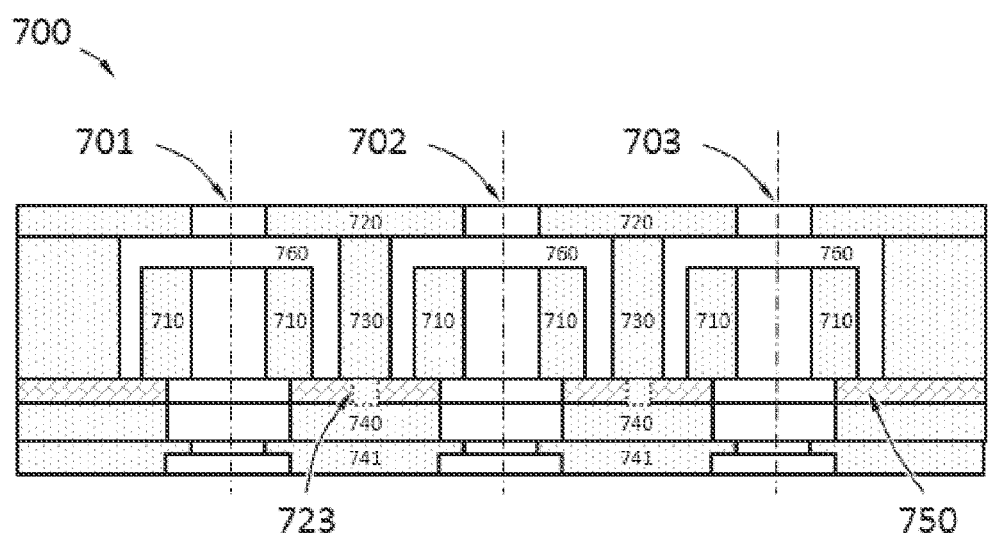

The example shown in FIG. 3D is the same as the example in FIG. 3I, except that the electrically insulating layer 750 extends between the third electrically conductive layer 730 and the second electrically conductive layer 740. The electrically insulating layer 750 electrically insulates the second electrically conductive layer 740 from the optics elements 710. The electrically insulating layer 750 may also insulate the second electrically conductive layer 740 from the third electrically conductive layer 730 and the first electrically conductive layer 720. The electrically insulating layer 750 may have one or more electrically conductive vias 723 through it and thereby electrically connect the second electrically conductive layer 740 to the third electrically conductive layer 730 by the one or more electrically conductive vias 723 and the conductive vias 723 electrically connect the second electrically conductive layer 740 to the third electrically conductive layer 730. The electrically insulating layer 750 can be very thin, such as less than 100 microns, less than 50 microns or less than 10 microns. The electrically insulating layer 750 can be an oxide, nitride or any other suitable material.

FIG. 3E and FIG. 3F each schematically show a portion 700 of a source-conversion unit of a multi-beam apparatus, according to an embodiment. The examples shown in FIG. 3E and FIG. 3F are the same as the examples in FIG. 3C and FIG. 3D, respectively, except that the electrically insulating layer 750 has an electrically conductive via 723 encircling each of the cavities 760 and the electrically conductive via 723 electrically connects the third electrically conductive layer 730 to the first electrically conductive layer 720 or the second electrically conductive layer 740. FIG. 3G schematically shows a cross-sectional view along section B-B of FIG. 3C or FIG. 3D.

FIG. 3I schematically shows a portion 700 of a source-conversion unit of a multi-beam apparatus, according to an embodiment. The example shown in FIG. 3H is the same as the example in FIG. 3C, except that the portion 700 additional has a fourth electrically conductive layer 721 upstream to the first electrically conductive layer 720. The fourth electrically conductive layer 721 may be directly bonded to the first electrically conductive layer 720. The fourth electrically conductive layer 721 and the first electrically conductive layer 720 may have the same material. The fourth electrically conductive layer 721 has openings whose sidewall is thinned to reduce scattering of charged particles thereon. To thin the sidewall, the openings can have an inverted funnel or counterbore shape as shown in FIG. 3H.

FIG. 3I schematically shows a portion 700 of a source-conversion unit of a multi-beam apparatus, according to an embodiment. The example shown in FIG. 3I is the same as the example in FIG. 3D, except that the portion 700 additional has a fifth electrically conductive layer 741 downstream to the second electrically conductive layer 740. The fifth electrically conductive layer 741 may be directly bonded to the second electrically conductive layer 740. The fifth electrically conductive layer 741 and the second electrically conductive layer 740 may have the same material. The fifth electrically conductive layer 741 has openings whose sidewall is thinned to reduce scattering of charged particles thereon. To thin the sidewall, the openings can have an inverted funnel or counterbore shape as shown in FIG. 3I.

The materials suitable for the first electrically conductive layer 720, the third electrically conductive layer 730 and the second electrically conductive layer 740 may include semiconductors (e.g., silicon), and metals (e.g., gold). The first electrically conductive layer 720, the third electrically conductive layer 730 and the second electrically conductive layer 740 do not necessarily have the same materials. The first electrically conductive layer 720, the second electrically conductive layer 740, the third electrically conductive layer 730 can respectively be made from a semiconductor wafer, a semiconductor wafer with metal (e.g., gold) coating, or a dielectric plate with metal (e.g., gold) coating. The optics elements 710 can be made from a semiconductor wafer. The optics elements 710 and the third electrically conductive layer 730 can be made from a same semiconductor wafer, a same semiconductor wafer with metal (e.g., gold) coating, or a same dielectric plate with metal (e.g., gold) coating. The source-conversion unit shown in FIG. 3A-FIG. 3I can help reduce or eliminate crosstalk and field distribution deformation of the optics elements 710.

Figure 4A:
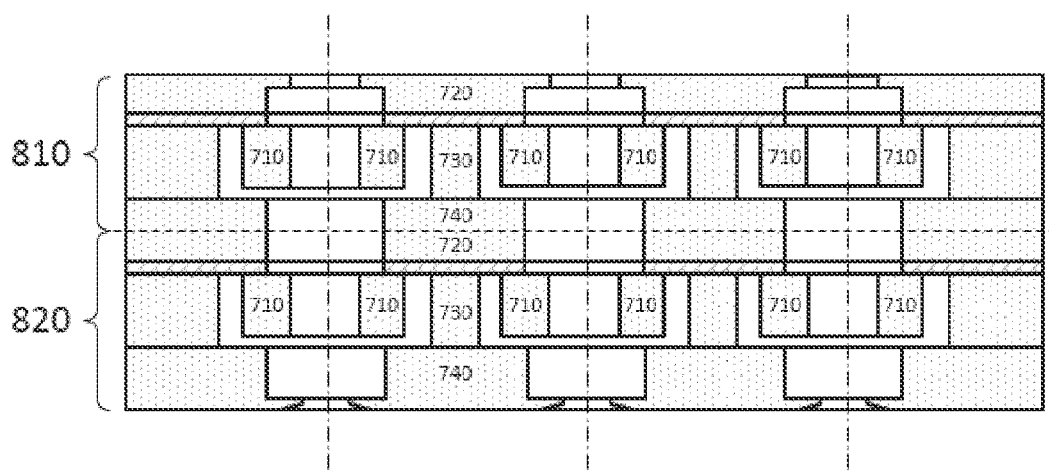
FIG. 4A schematically shows that two of the portions of FIG. 3C are stacked.

A source-conversion unit may have portions 700 in FIG. 3A-FIG. 3I stacked on one another. For example, FIG. 4A schematically shows a source-conversion unit including two of the portions 810 and 820 of FIG. 3C stacked on each other. The second electrically conductive layer 740 of the portion 810 upstream in the stack and the first electrically conductive layer 720 of the portion 820 downstream in the stack can be merged as a single layer. The optics elements 710 in the portion 810 may be micro-deflectors; the optics elements 710 in the portion 820 may be micro-compensators, which may comprise micro-lenses and micro-stigmators. In alternative, the optics elements 710 along the same path may collectively serve as a micro-compensator. The openings in the second electrically conductive layer 740 of the portion 820 or the openings in the first electrically conductive layer 720 of the portion 810 may serve as the openings in the electrically conductive layer 412 in FIG. 1A, FIG. 1B or FIG. 1C. The sidewall of the openings may be thinned to reduce scattering of charged particles thereon. To thin the sidewall, the openings can have an inverted funnel or counterbore shape as shown in FIG. 4A.

Figure 4B:
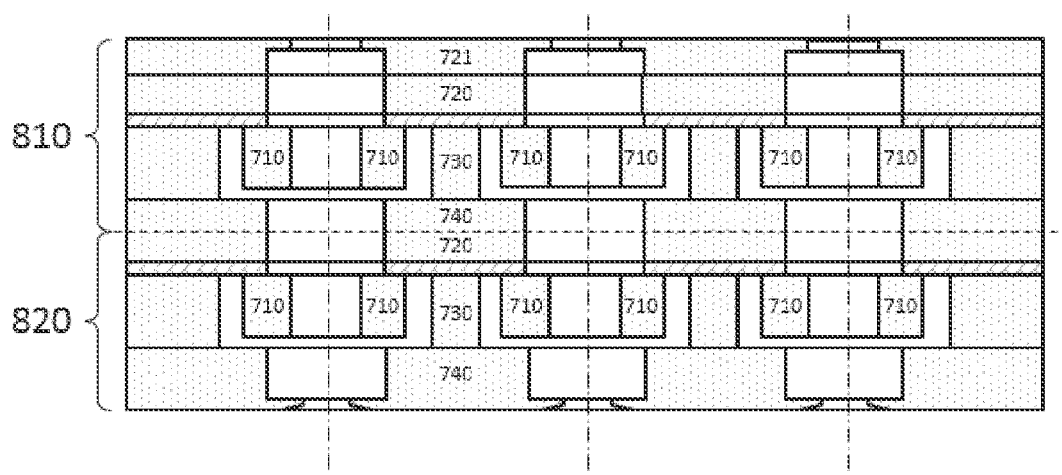
FIG. 4B shows another example of the source-conversion unit, which is similar to the source-conversion unit in FIG. 4A except that one of the two portions is the portion in FIG. 3H.

FIG. 4B shows another example of the source-conversion unit, which is similar to the source-conversion unit in FIG. 4A except that the portion 810 is the portion in FIG. 3I.

Figure 5A:
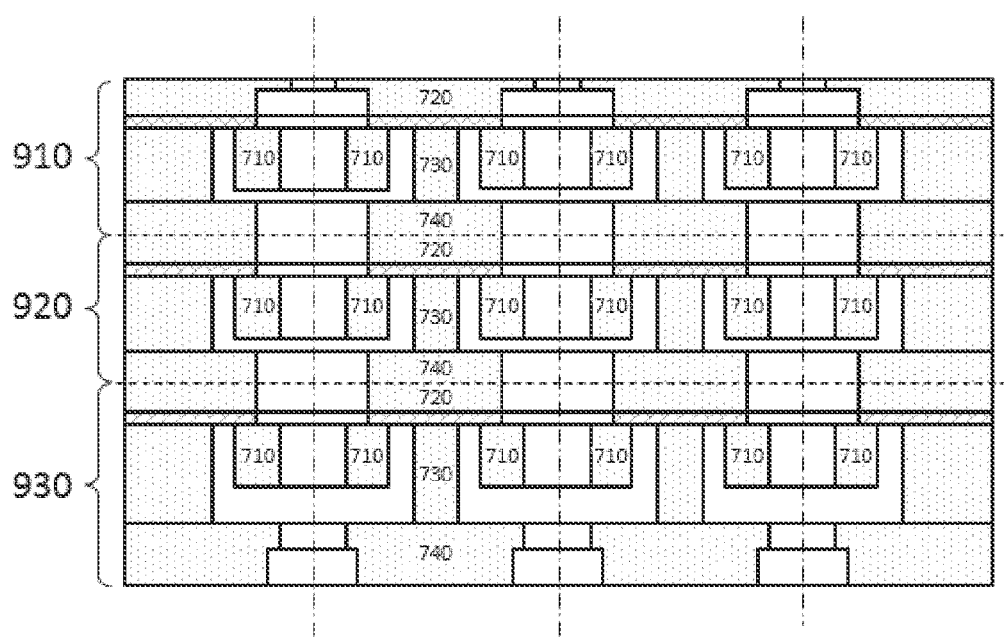
FIG. 5A schematically shows that three of the portions of FIG. 3C am stacked.

FIG. 5A schematically shows a source-conversion unit including three of the portions 910, 920 and 930 of FIG. 3C stacked on one another. The second electrically conductive layer 740 of the portion 910 upstream in the stack and the first electrically conductive layer 720 of the portion 920 in the middle of the stack can be merged as a single layer; the second electrically conductive layer 740 of the portion 920 in the middle of the stack and the first electrically conductive layer 720 of the portion 930 downstream in the stack can be merged as a single layer. The optics elements 710 in the portions 910 and 920 may be micro-compensators, micro-lenses and micro-stigmators; the optics elements 710 in the portion 930 can be micro-deflectors. The openings in the first electrically conductive layer 720 of the portion 910 may serve as the openings in the electrically conductive layer 412 in FIG. 11 or FIG. 1C. The sidewall of the openings may be thinned to reduce scattering of charged particles thereon. To thin the sidewall, the openings can have an inverted funnel or counterbore shape as shown in FIG. 5A.

Figure 5B:
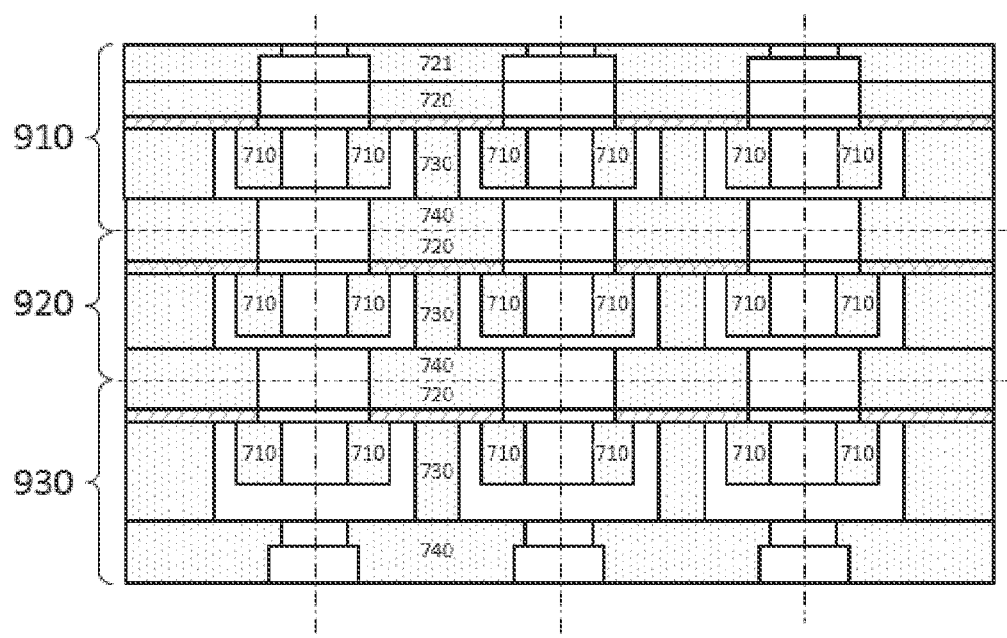
FIG. 5B shows another example of the source-conversion unit, which is similar to the source-conversion unit in FIG. 5A except that one of the three portions is the portion in FIG. 3I.

FIG. 5B shows another example of the source-conversion unit, which is similar to the source-conversion unit in FIG. 5A except that the portion 910 is the portion in FIG. 3H.

Figure 6A:
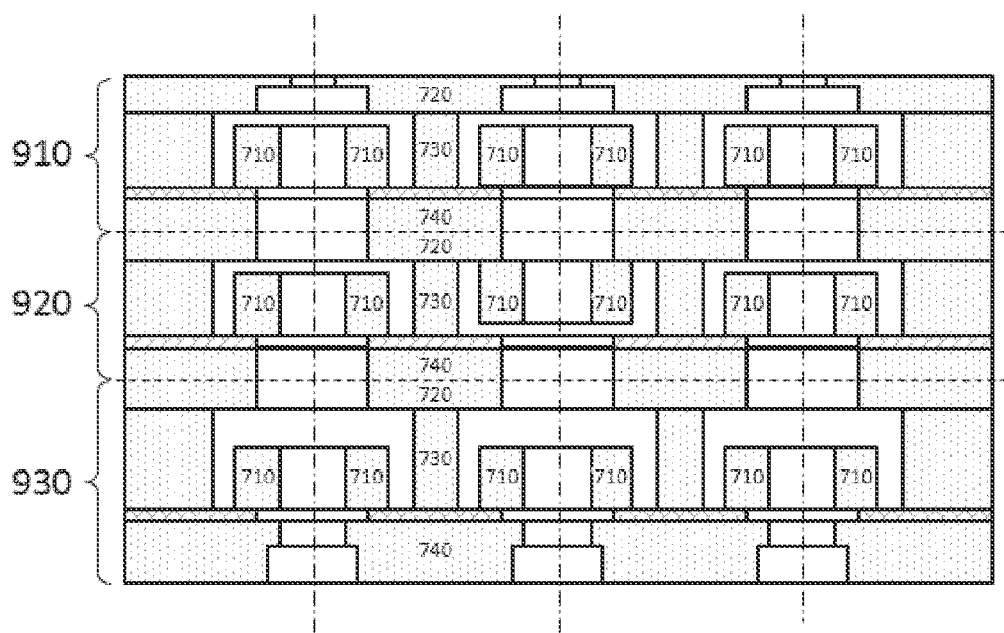
FIG. 6A schematically shows that three of the portions of FIG. 3I) are stacked.

FIG. 6A schematically shows a source-conversion unit including three of the portions 910, 920 and 930 of FIG. 3D stacked on one another. The second electrically conductive layer 740 of the portion 910 upstream in the stack and the first electrically conductive layer 720 of the portion 920 in the middle of the stack can be merged as a single layer; the second electrically conductive layer 740 of the portion 920 in the middle of the stack and the first electrically conductive layer 720 of the portion 930 downstream in the stack can be merged as a single layer. The optics elements 710 in the portions 910 and 920 may be micro-compensators, microlenses and micro-stigmators; the optics elements 710 in the portion 930 can be micro-deflectors. The openings in the first electrically conductive layer 720 of the portion 910 may serve as the openings in the electrically conductive layer 412 in FIG. 113 or FIG. 1C. The sidewall of the openings may be thinned to reduce scattering of charged particles thereon. To thin the sidewall, the openings can have an inverted funnel or counterbore shape as shown in FIG. 6A.

Figure 6B:
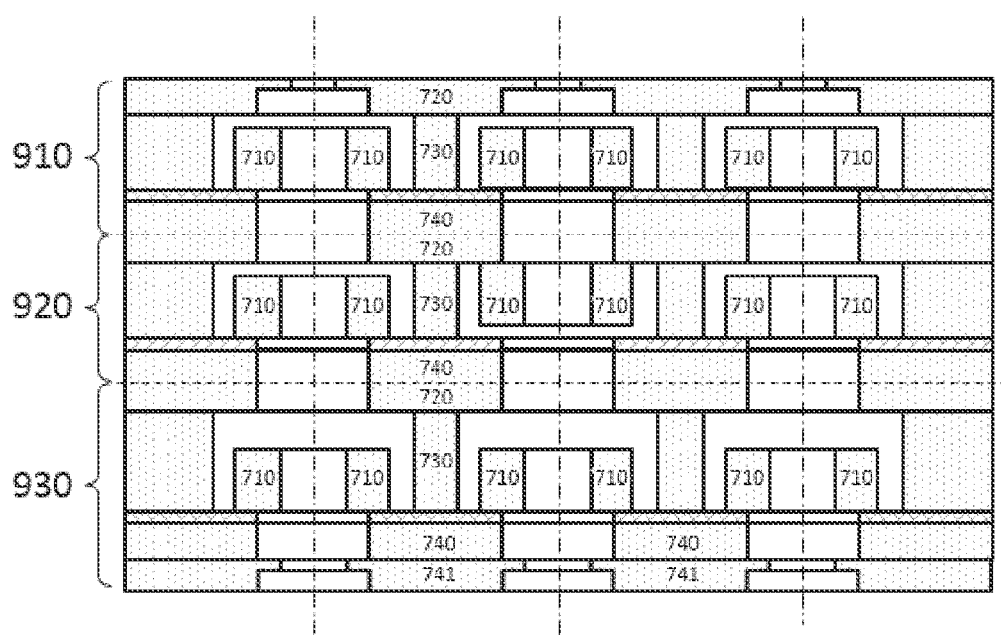
FIG. 6B shows another example of the source-conversion unit, which is similar to the source-conversion unit in FIG. 6A except that one of the three portions is the portion in FIG. 3I.

FIG. 6B shows another example of the source-conversion unit, which is similar to the source-conversion unit in FIG. 6A except that the portion 930 is the portion in FIG. 3I.

Figure 7A:
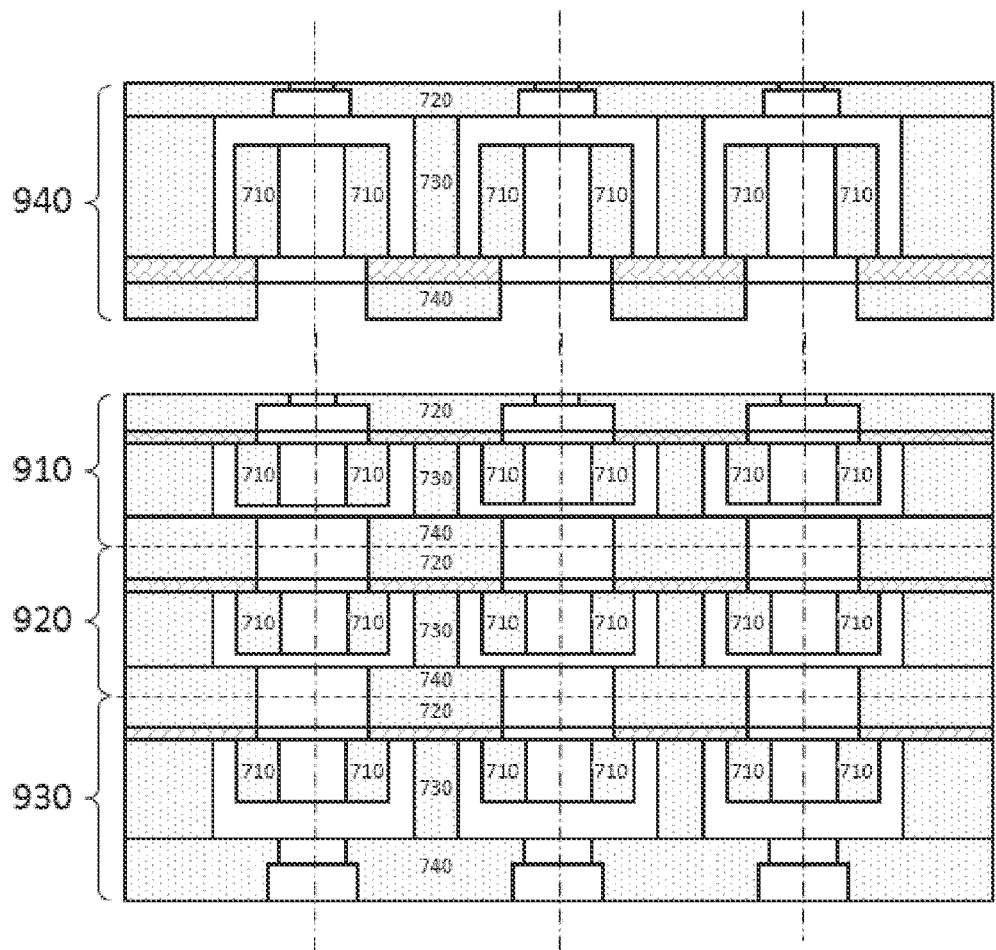
FIG. 7A schematically shows a source-conversion unit including three of the portions of FIG. 3C stacked on one another and a portion of FIG. 3D upstream.

FIG. 7A schematically shows a source-conversion unit including three of the portions 910, 920 and 930 of FIG. 3C stacked on one another (i.e., the structure of FIG. 5A), and a portion 940 of FIG. 3D upstream to the stack of the portions 910, 920 and 930. The optics elements 710 in the portions 910 and 920 may be micro-compensators, micro-lenses and micro-stigmators; the optics elements 710 in the portion 930 can be micro-deflectors. The openings in the first electrically conductive layer 720 of the portion 910 may serve as the openings in the electrically conductive layer 412 in FIG. 1C. The sidewall of the openings may be thinned to reduce scattering of charged particles thereon. To thin the sidewall, the openings can have an inverted funnel shape as shown in FIG. 6A. The optics elements 710 in the portion 940 may be pre-bending micro-deflectors. The sidewall of the openings in the first electrically conductive layer 720 of the portion 940 may be thinned to reduce scattering of charged particles thereon. To thin the sidewall, the openings can have an inverted funnel or counterbore shape.

Figure 7B:
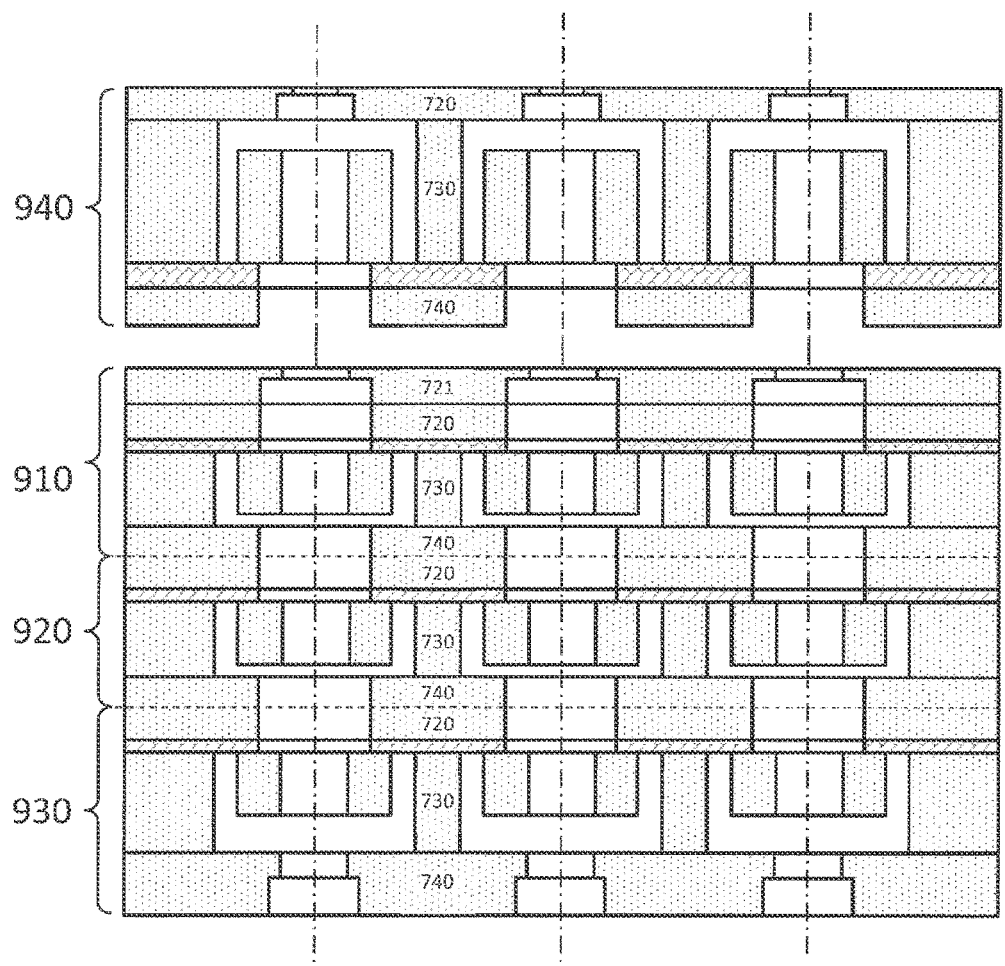
FIG. 7B shows another example of the source-conversion unit, which is similar to the source-conversion unit in FIG. 7A except that one of the three portions is the portion in FIG. 3H.

FIG. 7B shows another example of the source-conversion unit, which is similar to the source-conversion unit in FIG. 7A except that the portion 910 is the portion in FIG. 3H.

Although the disclosure above is made with respect to multi-beam apparatuses (i.e., apparatuses that can carry out charged particle beam inspection using multiple beams of charge particles, where the charged particles in the multiple beams are from a single source), the embodiments may be applicable in multi-column apparatuses (i.e., apparatuses that can carry out charged particle beam inspection using multiple beams of charge particles, where the multiple beams of charge particles are produced from multiple sources). Additional descriptions of multi-column apparatuses may be found in U.S. Pat. No. 8,294,095, the disclosure of which is hereby incorporated by reference in its entirety.

The embodiments may further be described using the following clauses:

1. An apparatus comprising:
   a first electrically conductive layer;
   a second electrically conductive layer;
   a plurality of optics elements between the first electrically conductive layer and the second electrically conductive layer, wherein the plurality of optics elements are configured to influence a plurality of beams of charged particles;
   a third electrically conductive layer between the first electrically conductive layer and the second electrically conductive layer; and an electrically insulating layer physically connected to the optics elements, wherein the electrically insulating layer is configured to electrically insulate the optics elements from the first electrically conductive layer, and the second electrically conductive layer.
2. The apparatus of clause 1, wherein the third electrically conductive layer comprises a plurality of holes, wherein the holes house the optics elements.
3. The apparatus of any one of clauses 1-2, wherein the optics elements are electrically insulated from the third electrically conductive layer.
4. The apparatus of any one of clauses 1-3, wherein the third electrically conductive layer is electrically connected to the first electrically conductive layer, the second electrically conductive layer, or both.
5. The apparatus of any one of clauses 1-4, wherein the first electrically conductive layer and the second electrically conductive layer comprise openings, wherein the openings and the optics elements collectively form paths of the plurality of beams of charged particles.
6. The apparatus of clause 5, wherein the openings have an inverted funnel or counterbore shape.
7. The apparatus of any one of clauses 1-6, wherein the third electrically conductive layer is positioned between at least two of the optics elements.
8. The apparatus of any one of clauses 1-7, wherein the first electrically conductive layer, the second electrically conductive layer, and the third electrically conductive layer collectively form cavities that accommodate the optics elements, wherein the cavities are configured to electrically shield the optics elements from one another.
9. The apparatus of any one of clauses 1-8, wherein the electrically insulating layer comprises discrete portions, each of which is physically connected to one of the optics elements.
10. The apparatus of any one of clauses 1-9, wherein the electrically insulating layer is physically connected to the first electrically conductive layer, the second electrically conductive layer, or the third electrically conductive layer.
11. The apparatus of any one of clauses 1-10, wherein the electrically insulating layer is configured to provide mechanical support to the optics elements.
12. The apparatus of any one of clauses 1-11, wherein the electrically insulating layer is positioned upstream with respect to the optics elements.
13. The apparatus of any one of clauses 1-12, wherein the electrically insulating layer is positioned downstream with respect to the optics elements.
14. The apparatus of any one of clauses 1-13, wherein the electrically insulating layer extends between the third electrically conductive layer and the first electrically conductive layer.
15. The apparatus of clause 14, wherein the electrically insulating layer insulates the first electrically conductive layer from the third electrically conductive layer, the second electrically conductive layer, and the optics elements.
16. The apparatus of clause 14, wherein the electrically insulating layer comprises an electrically conductive via through the electrically insulating layer, wherein the electrically conductive via electrically connects the first electrically conductive layer to the third electrically conductive layer.
17. The apparatus of clause 16, wherein the electrically conductive via encircles a cavity formed by the first electrically conductive layer, the second electrically conductive layer, and the third electrically conductive layer and housing one of the optics elements.
18. The apparatus of any one of clauses 1-13, wherein the electrically insulating layer extends between the third electrically conductive layer and the second electrically conductive layer.
19. The apparatus of clause 18, wherein the electrically insulating layer insulates the second electrically conductive layer from the third electrically conductive layer, the first electrically conductive layer, and the optics elements.
20. The apparatus of clause 18, wherein the electrically insulating layer comprises an electrically conductive via through the electrically insulating layer, wherein the electrically conductive via electrically connects the second electrically conductive layer to the third electrically conductive layer.
21. The apparatus of clause 20, wherein the electrically conductive via encircles a cavity formed by the first electrically conductive layer, the second electrically conductive layer, and the third electrically conductive layer and housing one of the optics elements.
22. The apparatus of any one of clauses 1-21, wherein the first electrically conductive layer, the second electrically conductive layer and the third electrically conductive layer comprise a semiconductor or a metal.
23. The apparatus of any one of clauses 1-22, wherein the optics elements are selected from a group consisting of a lens, a stigmator, a deflector, and a combination thereof.
24. The apparatus of any one of clauses 1-23, wherein the optics elements are configured to generate an electric field selected from a group consisting of a round-lens electrostatic field, an electrostatic dipole field and an electrostatic quadrupole field.
25. The apparatus of any one of clauses 1-24, wherein at least one of the optics elements comprises multiple poles.
26. The apparatus of any one of clauses 1-25, wherein the first electrically conductive layer, the second electrically conductive layer and the third electrically conductive layer are configured to reduce crosstalk or field distribution deformation of the optics elements.
27. The apparatus of any one of clauses 1-26, further comprising a detector configured to capture a signal produced from an interaction of the beams and a sample.
28. The apparatus of clause 27, wherein the signal comprises secondary electrons or backscattered electrons, Auger electrons, X-ray, or cathodoluminescence.
29. The apparatus of any one of clauses 1-28, wherein the charged particles comprise electrons.
30. An apparatus comprising:
  a first electrically conductive layer;
  a second electrically conductive layer;
  a plurality of optics elements between the first electrically conductive layer and the second electrically conductive layer, wherein the plurality of optics elements are configured to influence a plurality of beams of charged particles;
  a third electrically conductive layer between the first electrically conductive layer and the second electrically conductive layer; and
  an electrically insulating layer physically connected to the optics elements, wherein the electrically insulating layer is configured to electrically insulate the optics elements from the first electrically conductive layer, and the second electrically conductive layer;

wherein the electrically insulating layer extends between the third electrically conductive layer and the first electrically conductive layer, or between the third electrically conductive layer and the second electrically conductive layer.

31. An apparatus comprising:
a first electrically conductive layer;
a second electrically conductive layer;
a plurality of optics elements between the first electrically conductive layer and the second electrically conductive layer, wherein the plurality of optics elements are configured to influence a polarity of beams of charged particles;
a third electrically conductive layer between the first electrically conductive layer and the second electrically conductive layer;
an electrically insulating layer physically connected to the optics elements, wherein the electrically insulating layer is configured to electrically insulate the optics elements from the first electrically conductive layer, and the second electrically conductive layer; and
a fourth electrically conductive layer in contact with and upstream to the first electrically conductive layer.

32. An apparatus comprising:
a first electrically conductive layer;
a second electrically conductive layer;
a plurality of optics elements between the first electrically conductive layer and the second electrically conductive layer, wherein the plurality of optics elements are configured to influence a plurality of beams of charged particles;
a third electrically conductive layer between the first electrically conductive layer and the second electrically conductive layer;
an electrically insulating layer physically connected to the optics elements, wherein the electrically insulating layer is configured to electrically insulate the optics elements from the first electrically conductive layer, and the second electrically conductive layer; and
a fifth electrically conductive layer in contact with and downstream to the second electrically conductive layer.

33. A system comprising.
a source configured to produce charged particles;
an optics system configured to generate with the charged particles multiple probe spots on a surface of a sample and to scan the probe spots on the surface, the optics system comprising the apparatus of any one of clauses 1-32.

34. The system of clause 33, wherein the source is an electron gun.

While the concepts disclosed herein may be used for inspection on a sample such as a silicon wafer or a patterning device such as chrome on glass, it shall be understood that the disclosed concepts may be used with any type of samples, e.g., inspection of substrates other than silicon wafers.

The descriptions above are intended to be illustrative, not limiting. Thus, it will be apparent to one skilled in the art that modifications may be made as described without departing from the scope of the claims set out below.

What is claimed is:

1. A system comprising:
a charged particle optical device comprising:
a first electrically conductive layer;
a second electrically conductive layer;
a plurality of optics elements between the first electrically conductive layer and the second electrically conductive layer, wherein the plurality of optics elements are configured to influence a plurality of beams of charged particles;
a third electrically conductive layer between the first electrically conductive layer and the second electrically conductive layer;
an electrically insulating layer physically connected to the optics elements, wherein the electrically insulating layer is configured to electrically insulate the optics elements from the first electrically conductive layer, and the second electrically conductive layer; and
a fourth electrically conductive layer in contact with and upstream to the first electrically conductive layer.

2. The system of claim 1, wherein the fourth electrically conductive layer comprises openings having an inverted funnel or counterbore shape.

3. The system of claim 1, wherein:
the fourth electrically conductive layer comprises openings having a first opening size on a first surface of the fourth electrically conductive layer and a second opening size on a second surface of the fourth electrically conductive layer opposite the first surface;
the second surface is in contact with the first electrically conductive layer, and
the first opening size is smaller than the second opening size.

4. The system of claim 1, wherein the electrically insulating layer is configured to provide mechanical support to the optics elements.

5. The system of claim 1, wherein the optics elements comprise one or more of a micro-deflector, a micro-lens, a micro-stigmator, and a micro-compensator.

6. The system of claim 1, wherein the fourth electrically conductive layer and the first electrically conductive layer comprise a same material.

7. The system of claim 1, wherein the third electrically conductive layer comprises a plurality of holes, wherein the holes house the optics elements.

8. The system of claim 1, wherein the electrically insulating layer comprises at least one electrically conductive via therethrough, the electrically conductive via electrically connects the first electrically conductive layer to the third electrically conductive layer.

9. The system of claim 8, wherein the electrically conductive via encircles a cavity formed by the first electrically conductive layer, the second electrically conductive layer, and the third electrically conductive layer and housing one of the optics elements.

10. The system of claim 1, further comprising:
a source configured to produce charged particles;
wherein the charged particle optical device is configured to generate, with the charged particles, multiple probe spots on a surface of a sample and to scan the probe spots on the surface.

11. A system comprising:
a charged particle optical device, comprising:
a first electrically conductive layer;
a second electrically conductive layer;

a plurality of optics elements between the first electrically conductive layer and the second electrically conductive layer, wherein the plurality of optics elements are configured to influence a plurality of beams of charged particles;
a third electrically conductive layer between the first electrically conductive layer and the second electrically conductive layer;
an electrically insulating layer physically connected to the optics elements, wherein the electrically insulating layer is configured to electrically insulate the optics elements from the first electrically conductive layer, and the second electrically conductive layer; and
a fourth electrically conductive layer in contact with and downstream to the second electrically conductive layer.

12. The system of claim 11, wherein the fourth electrically conductive layer comprises openings having an inverted funnel or counterbore shape.

13. The system of claim 11, wherein:
the fourth electrically conductive layer comprises openings having a first opening size on a first surface of the fourth electrically conductive layer and a second opening size on a second surface of the fourth electrically conductive layer opposite the first surface;
the first surface is in contact with the second electrically conductive layer, and
the first opening size is smaller than the second opening size.

14. The system of claim 11, wherein the electrically insulating layer is configured to provide mechanical support to the optics elements.

15. The system of claim 11, wherein the optics elements comprise one or more of a micro-deflector, a micro-lens, a micro-stigmator, and a micro-compensator.

16. The system of claim 11, wherein the fourth electrically conductive layer and the first electrically conductive layer comprise a same material.

17. The system of claim 11, wherein the third electrically conductive layer comprises a plurality of holes, wherein the holes house the optics elements.

18. The system of claim 11, wherein the electrically insulating layer comprises at least one electrically conductive via therethrough, the electrically conductive via electrically connects the first electrically conductive layer to the third electrically conductive layer.

19. The system of claim 18, wherein the electrically conductive via encircles a cavity formed by the first electrically conductive layer, the second electrically conductive layer, and the third electrically conductive layer and housing one of the optics elements.

20. The system of claim 11, further comprising:
a source configured to produce charged particles;
wherein the charged particle optical device is configured to generate, with the charged particles, multiple probe spots on a surface of a sample and to scan the probe spots on the surface.

* * * * *